United States Patent
Azadeh

(10) Patent No.: US 9,525,267 B2
(45) Date of Patent: Dec. 20, 2016

(54) VERTICAL CAVITY SURFACE EMITTING LASER ASSEMBLY

(71) Applicant: O-NET COMMUNICATIONS (SHENZHEN) LIMITED, Shenzhen, Guangdong (CN)

(72) Inventor: Mohammad Azadeh, Guangdong (CN)

(73) Assignee: O-NET COMMUNICATIONS (SHENZHEN) LIMITED, Shenzhen (CN)

(*) Notice: Subject to any disclaimer, the term of this patent is extended or adjusted under 35 U.S.C. 154(b) by 0 days.

(21) Appl. No.: 14/963,276

(22) Filed: Dec. 9, 2015

(65) Prior Publication Data

US 2016/0172821 A1  Jun. 16, 2016

(30) Foreign Application Priority Data

Dec. 16, 2014 (CN) .......................... 2014 1 0782308

(51) Int. Cl.
*H01S 5/068* (2006.01)
*H01S 5/0683* (2006.01)
*H01S 5/183* (2006.01)
*G01J 1/42* (2006.01)
*H01S 5/022* (2006.01)
*H01S 5/42* (2006.01)

(52) U.S. Cl.
CPC ............ *H01S 5/0683* (2013.01); *G01J 1/4257* (2013.01); *H01S 5/02292* (2013.01); *H01S 5/183* (2013.01); *H01S 5/02296* (2013.01); *H01S 5/423* (2013.01)

(58) Field of Classification Search
CPC ........ H01S 5/005; H01S 5/0071; H01S 5/183; H01S 5/423
See application file for complete search history.

(56) References Cited

U.S. PATENT DOCUMENTS

2003/0081645 A1* 5/2003 Uebbing ............. H01S 5/02292
372/101

* cited by examiner

*Primary Examiner* — Armando Rodriguez

(57) ABSTRACT

The present patent application provides a vertical cavity surface emitting laser assembly. The vertical cavity surface emitting laser assembly includes a vertical cavity surface emitting laser, optical element and optical detector. The optical element includes an identation. A portion of the output light of the VCSEL passes through the indentation and to the optical detector to be used for power monitoring.

5 Claims, 1 Drawing Sheet

VERTICAL CAVITY SURFACE EMITTING LASER ASSEMBLY

CROSS-REFERENCE TO RELATED APPLICATION

The present application claims the benefit of Chinese Patent Application No. 201410782308.6 filed on Dec. 16, 2014, the contents of which are hereby incorporated by reference.

FIELD OF PATENT APPLICATION

The present patent application relates an optical communication device, and particularly relates to a vertical cavity surface emitting laser (VCSEL) assembly.

BACKGROUND

Edge emitting lasers and VCSELs are the primary devices used in optical communication. It is important to be able to measure the output optical power from these devices. Power monitoring of VCSELs is an important requirement both in terms of digital diagnostics and implementation of optical power control schemes to maintain the optical power of VCSELs over ambient temperature and device aging. While for edge emitting lasers this is usually done through the measurement of transmitting optical power from back facet of the device and calculation of the transmitting optical power ratio of the back facet and front facet, for VCSELs this back facet light is not available.

SUMMARY

To address the above problem, the present patent application provides a vertical cavity surface emitting laser (VCSEL) assembly.

The present patent application provides a VCSEL assembly. The VCSEL assembly includes a VCSEL, optical element and optical detector. The optical element is configured with identation. A portion of the output light of the VCSEL passes through the indentation and to the optical detector to be used for power monitoring.

In one embodiment of the present patent application, the optical element is a prism or a reflector.

In another embodiment of the present patent application, the optical element includes a reflecting surface, the reflecting surface and the direction of the output light of the VCSEL form an angle, the identation is located at a position of the reflecting surface where the output light of the VCSEL aims.

In another embodiment of the present patent application, the size of the identation is smaller than the spot size of the VCSEL.

In another embodiment of the present patent application, the identation is located at the optical field of the VCSEL and offset from the center of the optical field.

In another embodiment of the present patent application, the first surface of the identation is perpendicular to the output light of the VCSEL, the output light of the VCSEL passes through the first surface of the identation to the optical detector.

In another embodiment of the present patent application, the angle between the normal direction of the first surface of the identation and the output light of the VCSEL is small than the total reflection angle, the output light of the VCSEL passes through the first surface of the identation and reflect to the optical detector.

In another embodiment of the present patent application, the VCSEL are multiple and arranged in an array, the identation and the optical detector are multiple and are arranged corresponding to the array of the VCSELs.

In another embodiment of the present patent application, the VCSEL, the identation and the optical detector are arranged in 1×8 array.

The VCSEL assembly of the present patent application is simple in structure, easy to manufacture and more stable over life cycle.

In the VCSEL assembly of the present patent application, a portion of output light of the VCSEL which incident to the identation can transmit or reflect to the optical detector and that portion can be used to monitor the optical power of the VCSEL. The ratio of that portion to the whole output light of the VCSEL is determined by the proportion of the identation size and the spot size of the VCSEL. The present patent application achieves the output light splitting for the VCSEL by making identation on the reflecting surface. The manufacture process is simple and the cost is low. The identation structure is also simple and stable, and has good long term reliability.

DETAILED DESCRIPTION

Reference will now be made in detail to an embodiment of the vertical cavity surface emitting laser assembly disclosed in the present patent application, examples of which are also provided in the following description. Exemplary embodiments of the vertical cavity surface emitting laser assembly disclosed in the present patent application are described in detail, although it will be apparent to those skilled in the relevant art that some features that are not particularly important to an understanding of the vertical cavity surface emitting laser assembly may not be shown for the sake of clarity.

Furthermore, it should be understood that the vertical cavity surface emitting laser assembly disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
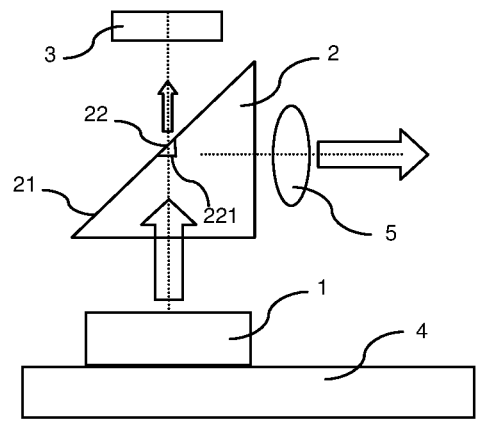
FIG. 1 illustrates a VCSEL assembly according to embodiment 1 of the present patent application.

As shown in FIG. 1, the output light of the VCSEL can be tapped and the small portion can be used to monitor the optical power of the VCSEL. The power output from the VCSEL is along the axis of the device and is vertical with reference to the substrate. The substrate supports the VCSEL and feeds it electrically. To couple the output light of the VCSEL into a fiber, usually a 45 Degree angle prism and some focusing lenses are used. The function of the prism is to bend the light by 90 degrees so that it is aligned with the main axis of the module which contains the VCSEL.

Embodiment 1

As shown in FIG. 1, the VCSEL assembly of this embodiment includes a VCSEL 1, prism 2 and optical detector 3. The reflecting surface 21 of the prism 2 is configured with identation 22 at the position where the output light of the VCSEL aims. A portion of the output light of the VCSEL 1 passes through the indentation 22 and to the optical detector 3 to be used for power monitoring. The VCSEL 1 is mounted on the ceramic substrate 4. The reflecting surface and the direction of the output light of the VCSEL 1 form an angle. The angle in this embodiment is 45 degree. The identation 22 is located at a position of the reflecting surface 21 where the output light of the VCSEL 1 aims.

The size of the identation 22 is smaller than the spot size of the VCSEL 1. In this embodiment, the first surface 221 of the indentation 22 is perpendicular to the direction of the output light of VCSEL 1. An optical detector 3 is arranged at the direction of the output light of VCSEL 1 and used to monitor the optical power of the portion of the output light transmits from the identation 22. The identation 22 in this embodiment is located at the optical field of the VCSEL 1. In this embodiment, the identation 22 offset from the center of the optical field to reduce the portion of the output light incidents to and passes through the identation 22. Thus the optical power loss due to the need for optical power monitor is reduced.

In FIG. 1, the VCSEL 1 is aligned and coupled with the prism 2. A big portion of the output light of VCSEL 1 is reflected by the reflecting surface 21 of the prism 2 and output from the prism 2. Then the big portion of the output light is coupled to the lens and output. The first surface 221 of the identation 22 is perpendicular to the output light of the VCSEL 1. Total internal reflection does not take place in the small area where the identation 22 locates. The small portion of output light will continue pass out of the prism 2 and is detected by optical detector 3. This small portion of output light can be used to monitor the optical power of VCSEL 1.

The split ratio of the identation 22, i.e., the proportion between the small portion of the output light which is detected by optical detector 3 and the big portion of the output light which is reflected by the reflecting surface 21 and output from the prism 2, is determined by the proportion of the identation 22 size and the spot size of the VCSEL. The split ratio of this embodiment is 1%-10%.

Embodiment 2

Figure 2:
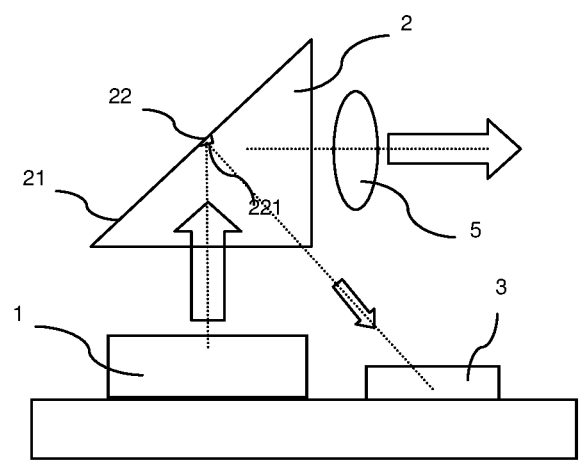
FIG. 2 illustrates a VCSEL assembly according to embodiment 2 of the present patent application.

As shown in FIG. 2, in this embodiment, the normal direction of the first surface 221 of the identation 22 and the output light of the VCSEL 1 form an angle. The optical detector 3 is located at the reflected output light direction of the VCSEL 1 by the first surface 221 of the identation 22. The angle between the normal direction of the first surface 221 of the identation 22 and the output light of the VCSEL 1 is small than the total reflection angle. For example, the angle is between 10-30 degrees. The optical detector 3 and the VCSEL 1 are on the same substrate. The substrate of this embodiment is ceramic. The reflected small portion of the output light in this embodiment follows a different path towards the plane of the VCSEL 1 comparing with embodiment 1. In this embodiment, the optical detector 3 is arranged at the same substrate of the VCSEL 1 and used to detect the optical power of the small portion reflected by identation 22. The identation 22 of this embodiment is located at the optical field of the VCSEL 1. In this embodiment, the identation 22 offset from the center of the optical field to reduce the portion of the output light incidents to and passes through the identation 22. Thus the optical power loss due to the need for optical power monitor is reduced.

In this embodiment, the angle between the normal direction of the first surface 221 of the identation 22 and the output light of the VCSEL 1 is 10-30 degree. The detailed angle selection needs to consider the size and fabrication requirements of the prism 2, the VCSEL 1 and the optical detector 3. The angle between the normal direction of the first surface 221 of the identation 22 and the output light of the VCSEL 1 as shown in FIG. 2 is 20 degree. Thus the angle between the output light of VCSEL 1 and the output light reflected by the first surface 221 of the identation 22 and detected by the optical detector 3 is 40 degree. This angle is suitable for the fabrication of the prism 2, the VCSEL 1 and the optical detector 3, etc.

Embodiment 3

The VCSEL of this embodiment are multiple and arranged in an array, the identation and the optical detector are multiple and are arranged corresponding to the array of the VCSELs. The VCSEL of this embodiment is arranged in 1×8 array. Correspondingly, the identation and the optical detector are arranged in 1×8 array too. This embodiment fabricates the multiple VCSELs into a monolithic integration array to achieve high density integration.

The VCSEL assembly of the present patent application, by making a small indentation in the reflecting surface of the prism, allows a portion of the output light to be transmitted or reflected to optical detector. The implementation of monitoring the output power of VCSEL is achieved. The small indentation can take a variety of forms, but in all cases, it creates a disturbance in the reflectance of the prism. The reflection of the light is based on the phenomenon of total internal reflection, and a critical angle. Because of the disturbance, the critical angle is not maintained in a small area, and therefore total internal reflection does not take place in that small area and therefore a portion of light will follow a different path. The light can either be leaked out, or be reflected back toward the substrate carrying the VCSEL. It can then be used as a monitoring signal for the optical power of the VCSEL. The ratio of the small portion of the output light transmitted or reflected by the identation is determined by the proportion of the identation 22 size and the spot size of the VCSEL. The present patent application achieves the output light splitting for the VCSEL by making identation on the reflecting surface. The manufacture process is simple and the cost is low. The identation structure is also simple and stable, and has good long term reliability.

The above embodiment describes the VCSEL assembly of the present patent application using prism as example. It should be noted that the prism can be replaced by reflecting mirror.

Although the patent application has been described with respect to certain embodiments, the description is not regarded as limiting of the patent application. The alternative changes or modifications of aspects of the embodiments of the patent application fall within the spirit of the present patent application.

What is claimed is:
1. A vertical cavity surface emitting laser assembly comprising:
 a vertical cavity surface emitting laser,
 an optical element comprising an indentation, and
 an optical detector, wherein the laser emits output light, a portion of the output light pass through the indentation and to an optical detector for power monitoring;

wherein the optical element comprises a reflecting surface, the reflecting surface and an direction of the output light of the vertical cavity surface emitting laser form an angle, the indentation is located at a position of the reflecting surface where the output light of the vertical cavity surface emitting laser aims;

wherein a size of the indentation is smaller than a spot size of the vertical cavity surface emitting laser.

2. The vertical cavity surface emitting laser assembly in claim 1, wherein the optical element is a prism or a reflector.

3. The vertical cavity surface emitting laser assembly in claim 1, wherein the indentation is located at an optical field of the vertical cavity surface emitting laser and offset from a center of the optical field.

4. The vertical cavity surface emitting laser assembly in claim 1, wherein a first surface of the indentation is perpendicular to the output light of the vertical cavity surface emitting laser, the output light of the vertical cavity surface emitting laser passes through the first surface of the indentation to the optical detector.

5. The vertical cavity surface emitting laser assembly in claim 1, wherein an angle between a normal direction of a first surface of the indentation and the output light of the vertical cavity surface emitting laser is small than a total reflection angle.

* * * * *